(12) United States Patent
Tang

(10) Patent No.: US 11,490,520 B2
(45) Date of Patent: Nov. 1, 2022

(54) PRINTED CIRCUIT BOARD, METHOD OF MANUFACTURING THE SAME, AND MOBILE TERMINAL

(71) Applicant: VIVO MOBILE COMMUNICATION CO., LTD., Chang'an Dongguan (CN)

(72) Inventor: Houxun Tang, Chang'an Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 80 days.

(21) Appl. No.: 16/963,433

(22) PCT Filed: Jan. 25, 2019

(86) PCT No.: PCT/CN2019/073168
§ 371 (c)(1),
(2) Date: Jul. 20, 2020

(87) PCT Pub. No.: WO2019/149148
PCT Pub. Date: Aug. 8, 2019

(65) Prior Publication Data
US 2021/0045248 A1  Feb. 11, 2021

(30) Foreign Application Priority Data

Jan. 30, 2018  (CN) .......................... 201810089210.0

(51) Int. Cl.
*H05K 1/18*  (2006.01)
*H05K 1/02*  (2006.01)
(Continued)

(52) U.S. Cl.
CPC .......... *H05K 1/183* (2013.01); *H05K 1/0298* (2013.01); *H05K 1/115* (2013.01); *H05K 3/0026* (2013.01);
(Continued)

(58) Field of Classification Search
CPC .......... H05K 1/18; H05K 1/181; H05K 1/182; H05K 1/83; H05K 1/0283; H05K 1/111;
(Continued)

(56) References Cited

U.S. PATENT DOCUMENTS 7,663,064 B2    2/2010  Dutta et al.
9,549,468 B1 *  1/2017  Tsai ................. H01L 23/49827
(Continued)

FOREIGN PATENT DOCUMENTS

CN    103517576 A        1/2014
CN    105164798 A  * 12/2015    ......... H01L 21/4857
(Continued)

OTHER PUBLICATIONS

CN-104703406-B (Translation) (Year: 2021).*
(Continued)

*Primary Examiner* — Hoa C Nguyen
*Assistant Examiner* — John B Freal
(74) *Attorney, Agent, or Firm* — von Briesen & Roper, s.c.

(57) ABSTRACT

A PCB, a method of manufacturing the PCB, and a mobile terminal are provided. The PCB includes a PCB body and a PCB element. A first surface of the PCB body is provided with a groove. The PCB element includes a connection terminal, and a part of the PCB element is arranged within the groove. The connection terminal includes a first portion arranged within the groove and a second groove arranged outside the groove, and the first portion is electrically connected to conductive layers in the PCB body.

16 Claims, 3 Drawing Sheets

(51) Int. Cl.
*H05K 1/11* (2006.01)
*H05K 3/00* (2006.01)
*H05K 3/30* (2006.01)
*H05K 3/40* (2006.01)

(52) U.S. Cl.
CPC ............ *H05K 3/30* (2013.01); *H05K 3/4038* (2013.01); *H05K 2201/09036* (2013.01); *H05K 2201/09518* (2013.01); *H05K 2201/10636* (2013.01); *H05K 2203/1453* (2013.01)

(58) Field of Classification Search
CPC ...... H05K 1/113; H05K 1/115; H05K 3/0026; H05K 3/30; H05K 3/4038; H05K 2201/09036; H05K 2201/09518; H05K 2201/10636; H05K 13/0439; H05K 13/0443
See application file for complete search history.

(56) References Cited

U.S. PATENT DOCUMENTS

| | | | |
|---|---|---|---|
| 2004/0246689 A1 | 12/2004 | Espinoza-Ibarra et al. | |
| 2005/0173783 A1 | 8/2005 | Chow et al. | |
| 2006/0248713 A1* | 11/2006 | Vatanparast | H05K 1/18 156/247 |
| 2009/0215231 A1 | 12/2009 | Inoue | |
| 2014/0055961 A1* | 2/2014 | Malek | H05K 3/3485 361/748 |
| 2014/0077912 A1* | 3/2014 | Wu | H01F 3/08 336/83 |
| 2014/0183751 A1* | 7/2014 | Yoshioka | H05K 1/181 257/773 |
| 2016/0020194 A1 | 1/2016 | Gottwald et al. | |

FOREIGN PATENT DOCUMENTS

| | | | | |
|---|---|---|---|---|
| CN | 105164798 A | | 12/2015 | |
| CN | 106231790 A | | 12/2016 | |
| CN | 104703406 B | * | 1/2018 | ............ H01L 23/15 |
| CN | 108282957 A | | 7/2018 | |
| JP | H10303039 A | * | 11/1998 | ............... H05K 1/18 |
| JP | H10303039 A | * | 11/1998 | ............... H05K 1/18 |
| JP | 2002198638 A | | 7/2002 | |
| JP | 2006032748 A | | 2/2006 | |
| JP | 2007311766 A | | 11/2007 | |
| JP | 2008130941 A | | 6/2008 | |
| JP | 2009200389 A | | 9/2009 | |
| WO | WO-2015059499 A2 | * | 4/2015 | ........... H05K 1/0204 |

OTHER PUBLICATIONS

JP-H10303039-A (Translation) (Year: 2021).*
CN-105164798-A (Translation) (Year: 2021).*
Extended European Search Report for related Application No. 19748194.8; dated Feb. 22, 2021.
International Search Report & Written Opinion related to Application No. PCT/CN2019/073168; dated Apr. 28, 2019.
1st Office Action from Japanese Patent Office in related Japanese Patent Application No. 2020-540770, dated Sep. 24, 2021.

* cited by examiner

PRINTED CIRCUIT BOARD, METHOD OF MANUFACTURING THE SAME, AND MOBILE TERMINAL

CROSS-REFERENCE TO RELATED APPLICATION

This patent application is a 35 USC § 371 U.S. national stage of international Application No. PCT/CN2019/073168 filed on Jan. 25, 2019, which claims a priority of the Chinese Patent Application No. 201810089210.0 filed on Jan. 30, 2018, which is incorporated herein by reference in its entirety.

TECHNICAL FIELD

The present disclosure relates to the technical field of electronic products, in particular to a Printed Circuit Board (PCB), a method of manufacturing the PCB, and a mobile terminal.

BACKGROUND

Being light and thin is a current development direction of a mobile terminal. However, due to diversified functions of the mobile terminal as well as the growing demand on the performance of the mobile terminal, more and more power source management modules, e.g., charging circuit, power supply network for a main chip, and a driving circuit of a display panel, have been applied in the mobile terminal. Most of the power source management modules are implemented in the form of switching power supply. Elements used in the switching power supply, e.g., a power inductor, have a relatively large size.

In addition, a switching noise existed in the switching power supply as well as electromagnetic radiation existed in the power inductor may interfere with the other functional circuit modules surrounding the switching power supply or the power inductor, so the switching power supply and the power inductor need to be placed inside a shielding case. Usually, the shielding case is made of a metallic material, e.g., a copper-nickel-zinc alloy or stainless steel, and it needs to reserve a certain safety clearance inside the shielding case to prevent the occurrence of a short circuit caused when a pin of a high element is in contact with a body of the shielding case.

In this case, a portion at a specific region of the PCB is protruded from a portion at the other region of the PCB. Usually, a height bottleneck occurs, and thereby a thickness of the entire mobile terminal is adversely affected. In addition, the position where the high element is located usually overlap an opposite large-size chip, and the high element is not supported at its periphery, so a body of the element and corresponding chip welding spots may be damaged in a static pressure scenario, and thereby the mobile terminal may be out of operation.

In addition, a large current flows through a portion of this kind of module connecting a large element, so a large quantity of via-holes needs to be provided between adjacent layers of circuits, so as to ensure a current flowing capability and reduce the impedance. However, the excessive via-holes may lead to additional impedance and loss.

In summary, the mobile terminal in the related art may have the problems that the thickness of the mobile terminal may be adversely affected by its inner structure, the mobile terminal may be easily out of operation in the static pressure scenario, and the excessive via-holes may lead to the impedance and loss.

SUMMARY

An embodiment of the present disclosure is to provide a PCB, a method of manufacturing the PCB, and a mobile terminal, so as to solve the problem in the related art where the thickness of the mobile terminal is adversely affected by its inner structure, the mobile terminal is easily out of operation in the static pressure scenario, and the excessive via-holes lead to the impedance and loss.

In one aspect, the present disclosure provides in some embodiments a PCB, including: a PCB body, a first surface of the PCB body being provided with a groove; and a PCB element including a connection terminal, a part of the PCB element being arranged within the groove, the connection terminal including a first portion arranged within the groove and a second portion arranged outside the groove, the first portion being electrically connected to conductive layers in the PCB body.

In another aspect, the present disclosure provides in some embodiments a method of manufacturing a PCB, including: forming a groove in a PCB body; and arranging a PCB element within the groove, so that a part of the PCB element is arranged within the groove. A connection terminal of the PCB element includes a first portion arranged within the groove and a second portion arranged outside the groove, and the first portion is electrically connected to conductive layers in the PCB body.

In yet another aspect, the present disclosure provides in some embodiments a mobile terminal, including the above-mentioned printed circuit board.

According to the embodiments of the present disclosure, the first surface of the PCB body may be provided with the groove, and a portion of the PCB element may be arranged in the groove. The connection terminal of the PCB element may include the first portion arranged in the groove and the second portion outside the groove, and the first portion may be electrically connected to the conductive layer in the PCB body. Through the above structure, it is able to reduce a height of the element protruding from the surface of the PCB body, thereby to reduce a thickness of a structure acquired through assembling the PCB with an electronic element. In addition, it is able to increase a safety clearance between an element body and a body of a shielding case in the case of a same height, and improve the resistance of the structure to an external static pressure, thereby to improve the reliability of the mobile terminal. Furthermore, the PCB element may be electrically connected to at least two conductive layers of the PCB body, so as to reduce the quantity of via-holes between the conductive layers, thereby to reduce the impedance and loss caused by the via-holes.

DETAILED DESCRIPTION

Figure 1:
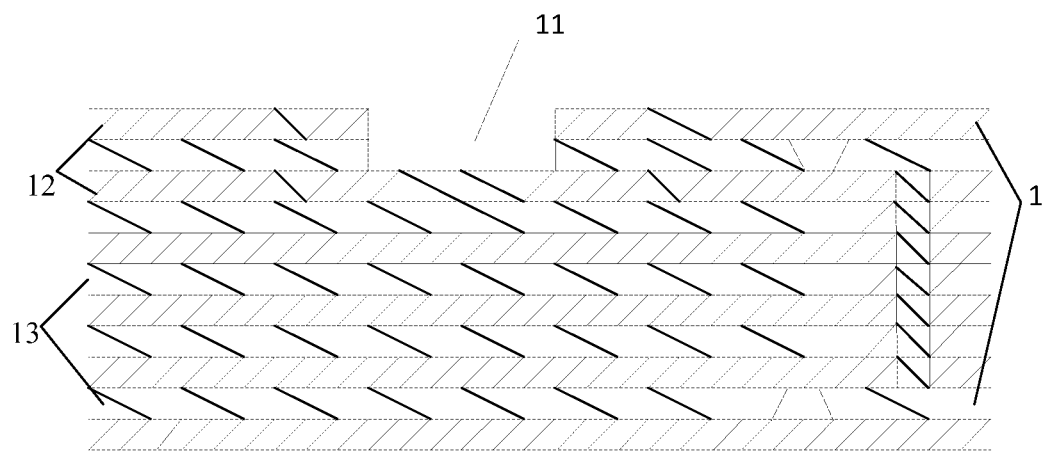
FIG. 1 is a first schematic view showing a PCB body provided with a groove according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The present disclosure provides in some embodiments a PCB which, as shown in FIGS. 1, 2, 3 and 4, includes: a PCB body 1 and a PCB element 2. A first surface of the PCB body 1 is provided with a groove 11. The PCB element 2 includes a connection terminal 21. A part of the PCB element 2 is arranged within the groove 11, the connection terminal 21 includes a first portion 211 arranged within the groove 11 and a second portion 212 arranged outside the groove 11. The first portion 211 is electrically connected to a conductive layer 12 in the PCB body 1.

According to the embodiments of the present disclosure, the PCB may include the PCB body 1 and the PCB element 2, the surface of the PCB body 1 may be provided with the groove 11, and a part of the PCB element 2 may be arranged within the groove 11. The PCB element 2 may include an element body 22 and the connection terminal 21. The connection terminal 21 may include the first portion 211 and the second portion 212. The first portion 211 is arranged within the groove 11 and electrically connected to the conductive layer 12 in the PCB body 1. The second portion 212 is arranged outside the groove 11.

Through the arrangement of the PCB element 2 within the groove 11, it is able to reduce a height of the PCB element 2 protruding from the surface of the PCB body 1, thereby to reduce a thickness of a structure formed by assembling the PCB body 1 with an electronic element. In addition, it is possible to increase a safety clearance between the element body 22 and a body of a shielding case under the condition of the same height, and improve the resistance of the structure to an external static pressure, thereby to improve the reliability of the mobile terminal.

In the embodiments of the present disclosure, the PCB body 1 may include a plurality of conductive layers 12, and a dielectric layer 13 may be arranged between two adjacent conductive layers 12. A conductive layer adjacent to the first surface of the PCB body 1 may be a first conductive layer, a conductive layer adjacent to a second surface of the PCB body 1 may be a second conductive layer, and the first surface may be opposite to the second surface.

The PCB body 1 includes the conductive layer 12 and the dielectric layer 13 positioned in parallel, with the conductive layer 12 and the dielectric layer 13 arranged alternately. To be specific, one dielectric layer 13 may be arranged between two adjacent conductive layers 12, and one conductive layer 12 may be arranged between two adjacent dielectric layers 13. In addition, a top layer and a bottom layer of the PCB body 1 may be both conductive layers 12. The top layer of the PCB body 1 may be a layer structure adjacent to the first surface, and the bottom layer may be a layer structure adjacent to the second surface. The dielectric layer 13 may be a non-conductive material, usually a material with a flame retardant material grade code of FR-4 may be used, and the conductive layer 12 may be a copper foil.

The second portion 212 of the connection terminal 21 may be connected to the first conductive layer through a conductive member 3. In the embodiments of the present disclosure, the conductive member 3 may be a solder. Through the solder, the second portion 212 of the connection terminal 21 outside the groove 11 may be adhered to the first conductive layer. Then, through a welding process, the second portion 212 of the connection terminal 21 may be connected to the first conductive layer. The solder may be a tin paste.

Figure 2:
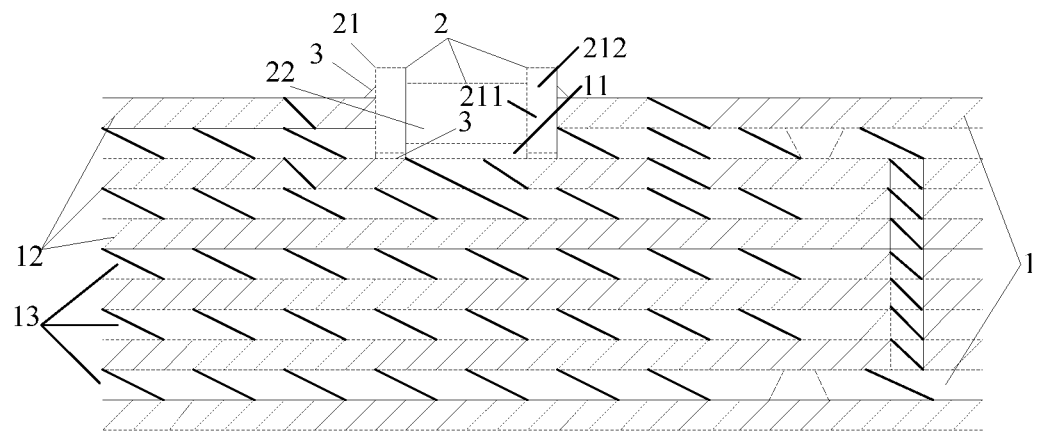
FIG. 2 is a first schematic view showing a PCB according to one embodiment of the present disclosure.

In a possible embodiment of the present disclosure, as shown in FIGS. 1 and 2, a side wall of the groove 11 may consist of a cross section of at least one conductive layer 12 and a cross section of at least one dielectric layer 13, and a bottom surface of the groove 11 may be the conductive layer 12. In addition, the middle part of the bottom surface may be a dielectric portion and the two ends form a conductive portion.

Through the groove 11 formed in the first surface of the PCB body 1, a notch may be formed in at least one conductive layer 12 and at least one dielectric layer 13. The first portion 211 of the connection terminal 21 within the groove 11 may be connected to the conductive layer 12 at the notch, and may be also in contact with the dielectric layer 13 at the notch.

When the dielectric portion is formed in the middle of the bottom surface of the groove 11 formed in the first surface of the PCB body 1 and the conductive portion is formed at two ends of the bottom surface of the groove 11, a bottom end of the first portion 211 of the connection terminal 21 may be in contact with the conductive portions of the bottom surface of the groove 11.

A conductive material dielectric in a portion of the area where the conductive layer 12 on the bottom surface of the groove 11 overlaps the notch, may be removed and then filled by a dielectric material during the formation of the PCB body 1, the part of the region that is removed is a central region overlapping the notch, so that a structure with a dielectric part in the middle of the bottom surface of groove 11 and a conductive part at two ends can be formed.

The side wall of the groove 11 may consist of a cross section of one conductive layer 12 and a cross section of one dielectric layer 13, or cross sections of two or more conductive layers 12 and cross sections of two or more dielectric layers 13. Regardless of the constitution of the cross section of the groove 11, the bottom surface of the groove 11 may be provided with such a structure that the dielectric portion is formed in middle of the bottom surface and the conductive portion is formed at two ends of the bottom surface. An area of the conductive portion formed at two ends of the bottom surface needs to be greater than or equal to an area of the bottom end of the first portion 211 of the connection terminal 21.

Based on the above structure, the embodiment of the present disclosure provides a structure that the first portion 211 of the connection terminal 21 may be connected to the cross section of the first conductive layer and the conductive portion of the bottom surface of the groove 11.

At this time, the side wall of the groove 11 may consist of the cross section of one conductive layer 12 and the cross section of one dielectric layer 13, i.e., the notch may be provided in the first conductive layer and the first dielectric layer, the first dielectric layer is a layer structure adjacent to the first conductive layer. A fourth conductive layer adjacent to the first dielectric layer may form the bottom surface of the groove 11. The dielectric portion may be formed in the middle of the region where the fourth conductive layer overlaps the notch, and the conductive portion may be formed at two ends.

The structure will be described hereinafter in more details.

The notch may be formed in the first conductive layer and the corresponding first dielectric layer in the PCB body 1, and the fourth conductive layer adjacent to the first conductive layer may form the bottom surface of the groove 11, and the fourth conductive layer and the first dielectric layer are subsequently arranged. It should be appreciated that, the conductive material at a part of the region where the fourth conductive layer overlaps the notch may be removed and filled by the dielectric material during the formation of the PCB body 1. To be specific, the conductive material at the middle of the region where the fourth conductive layer overlaps the notch may be removed and filled by, and the conductive material at two ends of the region where the fourth conductive layer overlaps the notch may be reserved, so as to acquire such a structure that the dielectric portion is formed in middle of the region where the fourth conductive layer overlaps the notch and the conductive portion is formed at two ends of the region where the fourth conductive layer overlaps the notch.

Further, in a thickness direction of the PCB body, the conductive portions at two ends of the fourth conductive layer overlapping the notch may be set non-overlapping with the first conductive layer. Hence, the conductive portions at two ends of the region where the fourth conductive layer overlaps the notch may form a connection region, which can be used to support the connection terminal 21.

A side wall of the first portion 211 of the connection terminal 21 may be electrically connected to the cross section of the first conductive layer. Each of an upper portion and a lower portion of the connection terminal 21 may have a size smaller than that of a middle portion of the connection terminal 21, so the side wall of the first portion 211 of the connection terminal 21 may be partially in contact with, or not in contact with, the cross section of the first dielectric layer. The bottom end of the first portion 211 of the connection terminal 21 may be connected to the fourth conductive layer. To be specific, the bottom end of the first portion 211 may be connected to the connection region. It should be appreciated that, through the dielectric portion formed on the fourth conductive layer, it is able to prevent the occurrence of short circuit.

In the embodiments of the present disclosure, the first portion 211 of the connection terminal 21 may be connected to the conductive portion at the bottom surface of the groove 11 through the conductive member 3.

The conductive portions may be formed at two ends of the bottom surface of the groove 11, and when the bottom end of the first portion 211 of the connection terminal 21 located in the groove 11 is connected to the bottom surface of the groove 11, the first portion 211 of the connection terminal 21 may be connected to the conductive portion at the bottom surface of the groove 11 through the conductive member 3.

Here, the conductive member 3 may be a solder. Through the solder, the bottom end of the first portion 211 of the connection terminal 21 within the groove 11 may be adhered to the conductive portion at the bottom surface of the groove 11. Then, through a welding process, the bottom end of the first portion 211 of the connection terminal 21 within the groove 11 may be connected to the conductive portion at the bottom surface of the groove 11. The solder may be a tin paste.

In the above structure, the connection terminal 21 within the groove 11 may be electrically connected to at least two conductive layers 12 of the PCB body 1, which can eliminate the need for excessive via-holes between the two conductive layers 12, so it is able to reduce the impedance and loss caused by the excessive via-holes.

Figure 3:
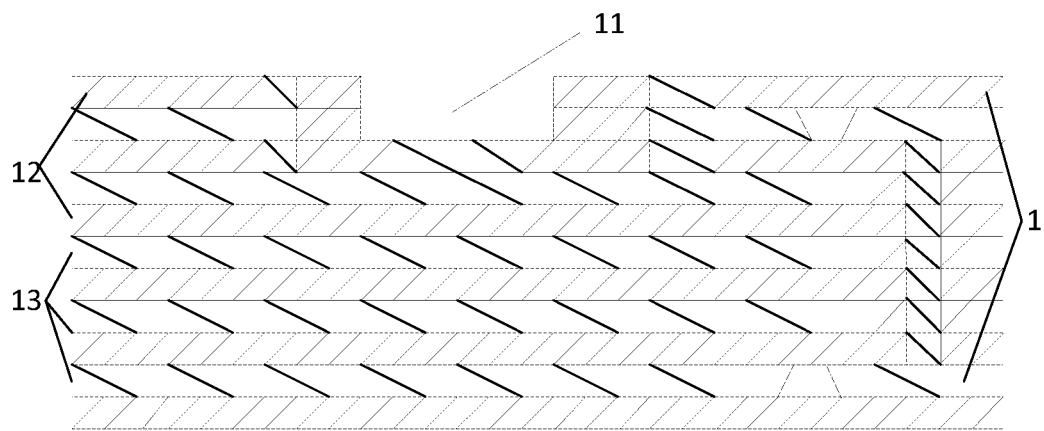
FIG. 3 is a second schematic view showing the PCB body provided with the groove according to one embodiment of the present disclosure.
Figure 4:
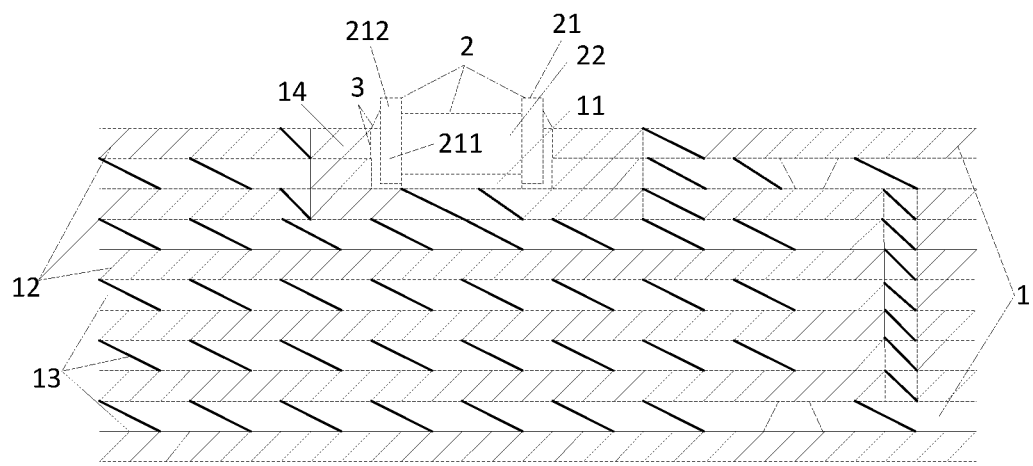
FIG. 4 is a second schematic view showing the PCB according to one embodiment of the present disclosure.

In another possible embodiment of the present disclosure, as shown in FIGS. 3 and 4, a conductive structure 14 may be provided in the PCB body 1, and the groove 11 may be formed in the conductive structure 14. The conductive structure 14 may comprise a portion of the first conductive layer, and a conductive material filled between the part of the first conductive layer and a part of a third conductive layer. The third conductive layer may be arranged adjacent to the first conductive layer, or spaced apart from the first conductive layer by a predetermined quantity of conductive layers. A part of the third conductive layer may form the bottom surface of the groove 11, a dielectric portion may be formed in the middle of the bottom surface, and a conductive portion may be formed at two ends of the bottom surface. A cross section of the conductive structure 14 may form the sidewalls of the groove 14.

The conductive structure 14 may be provided in the PCB body 1 and include a part of the first conductive layer and the conductive material filled between the part of the first conductive layer and a part of the third conductive layer. Here, the third conductive layer may be arranged adjacent to the first conductive layer, or spaced apart from the first conductive layer by the predetermined quantity of conductive layers.

Here, the part of the first conductive layer may be a first portion selected from the first conductive layer, and the corresponding part of the third conductive layer may be a first portion selected from the third conductive layer. After the selection, the conductive material may be filled in a region between the two first portions, so as to form the conductive structure 14.

Then, the groove 11 may be formed in the conductive structure 14. The side wall of the resultant groove 11 may be the cross section of the conductive structure 14, and the bottom surface of the resultant groove 11 may be a part of the third conductive layer. The bottom surface of the groove 11 may be of such a structure that the dielectric portion is formed in the middle and the conductive portion is formed at two ends.

The formation of the above structure will be described hereinafter.

A blind hole may be arranged between the first conductive layer and the third conductive layer of the PCB body 1, and the diameter of the blind hole needs to be greater than a length of the to-be-formed groove 11. A conductive material may be electroplated in the blind hole, so as to fill the conductive material between the part of the first conductive layer and the part of the third conductive layer. In the thickness direction of the PCB body 1, a part of the first conductive layer overlapping the blind hole and the conductive material in the blind hole may form the conductive structure 14.

It should be appreciated that, the groove 11 may be formed in the middle of the conductive structure 14. In the thickness direction of the PCB body 1, a conductive material at a part of a region where the third conductive layer overlaps the groove 11 may be removed and filled by a dielectric material, and a length of a region formed by removing the conductive material may be smaller than the length of the groove 11, so that the bottom surface of the groove 11 is of such a structure that the dielectric portion is formed in middle of the bottom surface of the groove 11 and the conductive portion is formed at two ends of the bottom surface.

The first portion 211 of the connection terminal 21 may be connected to the side wall of the groove 11 through the conductive member 3, and connected to the conductive portion at the bottom surface of the groove 11 through the conductive member 3.

The first portion 211 of the connection terminal 21 located in the groove 11 may be connected to the side wall and the bottom surface of the groove 11. To be specific, a side surface of the first portion 211 may be connected to the side wall of the groove 11 through the conductive member 3, and the bottom end of the first portion 211 may be connected to the conductive portion at the bottom surface of the groove 11 through the conductive member 3.

Here, the conductive member 3 may be a solder. Through the solder, the bottom end of the first portion 211 of the connection terminal 21 within the groove 11 may be adhered to the conductive portion at the bottom surface of the groove 11. Then, through a welding process, the bottom end of the first portion 211 of the connection terminal 21 within the groove 11 may be connected to the conductive portion at the bottom surface of the groove 11. The solder may be a tin paste.

Through the above structure, it is able to reduce the height of the element protruding from the surface of the PCB body and reduce the impedance and lost caused by the excessive via-holes. In addition, it is able to improve a current flowing capability between adjacent layers, and increase the contacting area between the solder and the connection terminal to improve the connection firmness.

In the embodiments of the present disclosure, as shown in FIGS. 2 and 4, the PCB element 2 may include two connection terminals 21 arranged opposite to each other, and each connection terminal 21 may include the first portion 211 within the groove 11. The first portion 211 of each connection terminal 21 may be electrically connected to the conductive layer 12 of the PCB body 1, and the conductive layers 12 connected to the two first portions 211 may be separated from each other.

The PCB element 2 may include the element body 22, and the two connection terminals 21 arranged opposite to each other and arranged at two sides of the element body 22 respectively. The two connection terminals 21 may be of a same structure, i.e., a part of each connection terminal 21, i.e., the first portion 211, may be arranged within the groove 11, and the second portion 212 of each connection terminal 21 may be arranged outside the groove 11.

When the first portion 211 of each connection terminal 21 is connected to the cross section of the first conductive layer and the conductive portion at the bottom surface of the groove 11, each of the two connection terminal 21 may be connected to the first conductive layer and the fourth conductive layer of the PCB body 1. The first conductive layer may be a top layer of the PCB body 1, and the fourth conductive layer may be spaced apart from the first conductive layer by the first dielectric layer. A part of the fourth conductive layer may form the bottom surface of the groove 11, the conductive portions may be formed at two ends of the bottom surface of the groove 11 respectively, and the dielectric portion may be formed in the middle of the bottom surface of the groove 11. The first portion 211 of each connection terminal 21 within the groove 11 may be connected to the cross section of the first conductive layer and the conductive portion of the fourth conductive layer. There may exist two cross sections of the first conductive layer, which are separated from each other. There may also exist two conductive portions of the fourth conductive layer, which are also separated from each other. The side wall of the first portion 211 of the connection terminal 21 within the groove 11 may be connected to the cross section of the first conductive layer, and the bottom end of the first portion 211 of the connection terminal 21 within the groove 11 may be connected to the conductive portion of the fourth conductive layer.

The bottom end of the first portion 211 of the connection terminal 21 may be adhered to the bottom surface of the groove 11 through the conductive member 3, and the second portion 212 of the connection terminal 21 may be adhered to the first conductive layer of the PCB body 1 through the conductive member 3. The conductive member 3 may be a solder. After the adhesion is achieved by the solder, a fixed connection may be achieved through a welding process. The solder may be a tin paste.

When the PCB body 1 includes the conductive structure 14, the groove 11 is arranged in the conductive structure 14 and the first portion 211 of each of the two connection terminals 21 is connected to the side wall of the groove 11 through the conductive member 3, and the first portion 211 of each of the two connection terminals 21 is connected to the conductive portion at the bottom surface of the groove 11 through the conductive member 3, the side wall of the first portion 211 of each of the two connection terminals 21 may be connected to the side wall of the groove 11, and the bottom end of the first portion 211 of each of the two connection terminals 21 may be connected to the bottom surface of the groove 11.

The bottom end of each connection terminal 21 may be adhered to the conductive portion at the bottom surface of the groove 11 through the conductive member 3, the side wall of first portion 211 of each connection terminal 21 may be adhered to an inner wall of the groove 11 through the conductive member 3, and the second portion 212 of each connection terminal 21 may be adhered to the first conductive layer of the PCB body 1 through the conductive member 3. The conductive member 3 may be a solder. After the adhesion is achieved by the solder, a fixed connection may be achieved through a welding process. The solder may be a tin paste.

In the embodiments of the present disclosure, prior to the application of the solder on a surface of the conductive layer at a position where the conductive layer is in contact with the connection terminal, an Organic Solderability Preservative (OSP) may be arranged on the surface of the conductive layer at a position where the conductive layer is in contact with the connection terminal, so as to protect the conductive layer. In the welding process, the OSP may be removed by the solder, so as to ensure the implementing of the welding.

In the embodiments of the present disclosure, the first conductive layer on the top and the second conductive layer on the bottom of the PCB body 1 need to be covered with ink. Of course, the position where the first conductive layer is connected to the connection terminal 21 can clear the ink.

According to the PCB in the embodiments of the present disclosure, the first surface of the PCB body may be provided with the groove, and a portion of the PCB element may be arranged in the groove. The connection terminal included in the PCB element may include the first portion arranged in the groove and the second portion arranged outside the groove, and the first portion may be electrically connected to the conductive layer in the PCB body. Through the above structure, it is able to reduce a height of the element protruding from the surface of the PCB body, thereby to reduce a thickness of a structure acquired through assembling the PCB with an electronic element. In addition, it is able to increase a safety clearance between an element body and a body of a shielding case in the case of a same height, and improve the resistance of the structure to an external static pressure, thereby to improve the reliability of the mobile terminal. Furthermore, the PCB element may be electrically connected to at least two conductive layers of the PCB body, so as to reduce the quantity of via-holes between the conductive layers, thereby to reduce the impedance and loss caused by the via-holes. Furthermore, it is able to improve a current flowing capability between adjacent layers, and increase a contacting area between the solder and the connection terminal to improve the connection firmness.

The present disclosure further provides in some embodiments a mobile terminal including the above-mentioned PCB.

Figure 5:
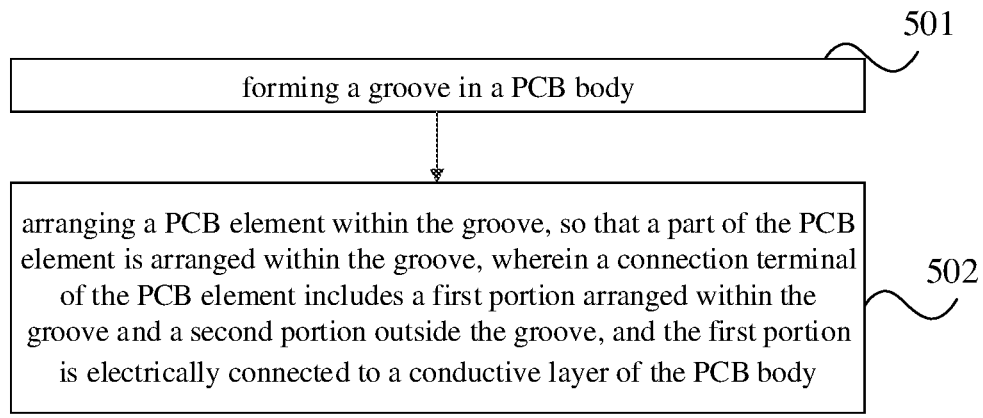
FIG. 5 is a flow chart of a method of manufacturing the PCB according to one embodiment of the present disclosure.

The present disclosure further provides in some embodiments a method of manufacturing a PCB which, as shown in FIG. 5, includes the following steps.

Step 501: forming a groove in a PCB body.

At first, the groove may be formed in the PCB body. Prior to the forming the groove, it is necessary to determine a structure of the PCB. The PCB body may include conductive layers and dielectric layers arranged parallel to each other and arranged alternately. To be specific, one dielectric layer may be arranged between two adjacent conductive layers, and one conductive layer may be arranged between two adjacent dielectric layers. In addition, a top layer and a bottom layer of the PCB body may be both conductive layers. The dielectric layer may be made of a non-conductive material, usually a material having a flame-retardant level FR-4, and each conductive layer may be made of a copper foil. The groove formed in the PCB body needs to receive a part of a PCB element, so the PCB element needs to be connected to the conductive layer of the PCB body, so as to ensure the effect of the PCB element.

The step of making the groove in the PCB body includes forming a groove using a laser beam on the first surface of the PCB body on which the wiring and drilling have been completed.

During the forming of the groove, the PCB body acquired after the lines and via-holes have been formed needs to be used, and then the groove may be formed in the first surface of the PCB body through the laser beam in accordance with predetermined dimension information.

A manufacture procedure of the groove will be described hereinafter.

The groove may be formed in the PCB body including a plurality of conductive layers, so as to form an inner wall of the groove with a cross section of at least one conductive layer and a cross section of at least one dielectric layer, and form a bottom surface of the groove with a conductive layer. A dielectric portion may be formed in the middle of the bottom surface, and a conductive portion may be formed at two ends of the bottom surface.

To be specific, a notch may be formed in the at least one conductive layer and the at least one dielectric layer of the PCB body. After the formation of the notch, the cross sections at the notch may form the inner wall of the groove. Because the groove needs to receive a part of the PCB element, one conductive layer of the PCB body may form the bottom surface of the groove, so as to ensure the connection effectiveness of the PCB. At this time, the groove needs to be formed by at least two conductive layers and the dielectric layer between the conductive layers.

The notch may be formed in a first conductive layer and a first dielectric layer of the PCB body, and a fourth conductive layer of the PCB body may serve as the bottom surface of the groove. At the notch, the cross sections of the first conductive layer and the first dielectric layer may form the inner wall of the groove, and a part of the fourth conductive layer may form the bottom surface of the groove. In the embodiments of the present disclosure, the first conductive layer may be a top layer of the PCB body, a second conductive layer may be a bottom layer of the PCB body, the first dielectric layer may be arranged adjacent to the first conductive layer, and the fourth conductive layer may be arranged adjacent to the first dielectric layer.

It should be appreciated that, at this time, during the formation of the PCB body, a conductive material at a part of a region where the fourth conductive layer overlaps the notch may be removed and filled by a dielectric material. A length of a region where the conductive material is removed may be smaller than a length of the notch, and the region where the conductive material is removed may be located in the middle of the notch, so the conductive material is still located at the two ends of the bottom surface of the groove formed by the fourth conductive layer. Further, in a thickness direction of the PCB body, there may exist a non-overlapping region, i.e., a conductive portion, between the bottom surface of the groove and the first conductive layer, so as to support, and be electrically connected to, the connection terminal.

The PCB element may include an element body and two connection terminals arranged at two opposite ends of the element body respectively. Through the above procedure, the dielectric portion may be formed in the middle of the bottom surface of the groove, so as to prevent the occurrence of a short circuit.

Figure 6:
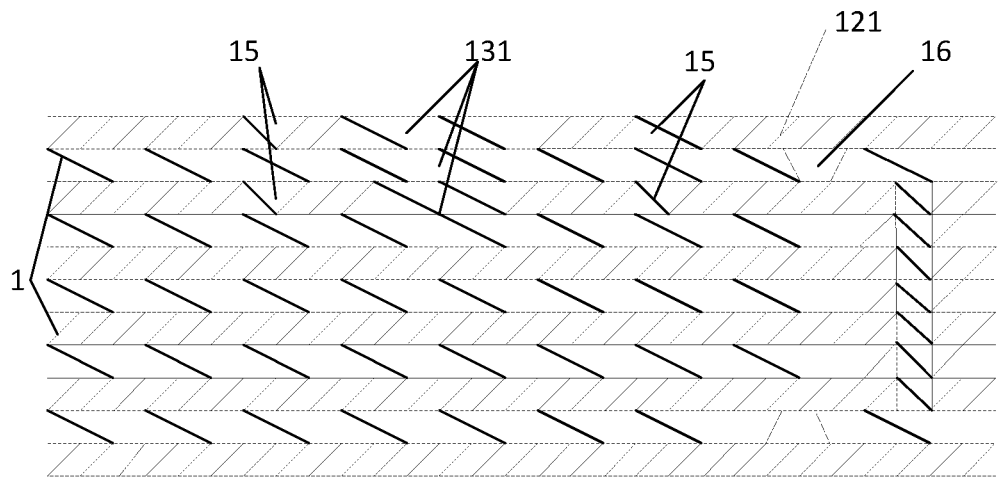
FIG. 6 is a schematic view showing the PCB body according to one embodiment of the present disclosure.

The PCB body will be manufactured as follows. With one conductive layer and a dielectric layer as a reference, the conductive layers and the dielectric layers may be formed alternately one on another in each direction, to acquire the PCB body. The top layer and the bottom layer of the PCB body may each be the conductive layer. When the groove is formed using the first conductive layer and the fourth conductive layer, after the formation of the fourth conductive layer, the conductive material at a region of the fourth conductive layer may be removed and filled with the dielectric material, and when the first conductive layer is formed, the conductive material at a region of the first conductive layer may be removed. The region of the first conductive layer where the conductive material is removed may overlap, and have an area greater than, the region of the fourth conductive layer where the conductive material is removed. In addition, the region of the fourth conductive layer where the conductive material is removed may be located in the middle of the region of the first conductive layer where the conductive material is removed. A specific structure is shown in FIG. 6, where 131 represents a dielectric region, and 121 represents a conductive region. Through the above structure, it is able to facilitate the subsequent formation of the groove and prevent the occurrence of a short circuit.

After the formation of the PCB, it is necessary to form lines and via-holes in the PCB through a conventional process. 15 represents the lines on the PCB, and 16 represents the via-holes in the PCB. Through the above steps, the PCB body for which the lines and the via-holes have been formed may be acquired. Then, the groove may be formed in the PCB body. FIG. 1 shows the PCB body with the groove, where 11 represents the groove.

In addition, the formation of the groove further includes the following steps. A blind hole may be formed in the PCB body including a plurality of conductive layers, so as to connect the first conductive layer to a third conductive layer. The first conductive layer may be a conductive layer adjacent to the first surface of the PCB body, and the third conductive layer may be a conductive layer adjacent to the first conductive layer or spaced apart from the first conductive layer by a predetermined quantity of conductive layers. Then, the conductive material may be filled into the blind hole, so as to form a whole conductive structure through a predetermined portion of the first conductive layer and the conductive material in the blind hole. The predetermined portion may be a portion of the first conductive layer corresponding to the blind hole. Then, the groove may be formed in the conductive structure.

To be specific, the conductive structure in the PCB body may consist of the predetermined portion of the first conductive layer and the conductive material in the blind hole, and the groove may be formed in the conductive structure. The portion of the connection terminal of the PCB element within the groove may be electrically connected to an inner wall of the groove and connected to a part of the bottom surface of the groove. The inner wall of the groove may be made of the conductive material, and the third conductive layer may be arranged adjacent to the first conductive layer or spaced apart from the first conductive layer by the predetermined quantity of conductive layers.

The following description will be given when the first conductive layer is arranged adjacent to the third conductive layer.

In the PCB body acquired after the lines and via-holes have been formed, the blind hole may be formed between the first conductive layer and the third conductive layer. A diameter of the blind hole needs to be greater than a length of the groove, and equal to a length of the predetermined portion. The conductive material may be electroplated in the blind hole, so as to fill the conductive material between the predetermined portion of the first conductive layer and a corresponding portion of the third conductive layer. The predetermined portion of the first conductive layer overlapping the blind hole and the conductive material in the blind hole may form the entire conductive structure. Then, the groove may be formed in the conductive structure.

It should be appreciated that, the groove may be formed in the middle of the conductive structure. In the thickness direction of the PCB body, the conductive material in the middle of the region where the third conductive layer overlaps the groove may be removed and filled by the dielectric material, and the conductive material at two ends of the region where the third conductive layer overlaps the groove may be used to support the connection terminal. FIG. 3 shows the PCB body with the groove, where 11 represents the groove.

Through the above structure, it is able to reduce the height of the element protruding from the surface of the PCB body and reduce the impedance and lost caused by the excessive via-holes. In addition, it is able to improve a current flowing capability between adjacent layers, and increase a contacting area between the solder and the connection terminal to improve the connection firmness.

Step 502: arranging the PCB element within the groove, so that a part of the PCB element is arranged within the groove. The connection terminal of the PCB element may include a first portion arranged within the groove and a second portion outside the groove, and the first portion may be electrically connected to the conductive layer in the PCB body.

Prior to arranging the PCB element within the groove, it needs to apply a solder within the groove at a position where the connection terminal is to be connected to the conductive layer through a stencil printing process or a spraying process.

A procedure of arranging the PCB element within the groove will be described as follows. The PCB element may be arranged within the groove through a laminator, the second portion of the connection terminal of the PCB element may be connected to the first conductive layer adjacent to the first surface of the PCB body through a conductive member, and then the PCB body and the PCB element may move through a reflow oven so as to enable the PCB element to be connected to the PCB body through welding.

Through the above operations, the second portion of the connection terminal outside the groove may be connected to the first conductive layer adjacent to the first surface of the PCB body through the conductive member, and the PCB element may be connected to the PCB body through welding. The conductive member may be a solder.

According to the manufacturing method in the embodiments of the present disclosure, the groove may be formed in the first surface of the PCB body, so that a part of the PCB element may be arranged within the groove. The first portion of the connection terminal of the PCB element may be arranged within the groove and electrically connected to the conductive layer of the PCB body, and the second portion of the connection terminal of the PCB element may be arranged outside the groove and connected to the conductive layer at the surface of the PCB body. As a result, it is able to reduce the height of the element protruding from the surface of the PCB body, thereby to reduce a thickness of a structure acquired through assembling the PCB with an electronic element. In addition, it is able to increase a safety clearance between an element body and a body of a shielding case in the case of a same height, and improve the resistance of the structure to an external static pressure, thereby to improve the reliability of the mobile terminal. Furthermore, the PCB element may be electrically connected to at least two conductive layers of the PCB body, so as to reduce the quantity of via-holes between the conductive layers, thereby to reduce the impedance and loss caused by the via-holes. Furthermore, through different groove arrangement modes, it is able to improve a current flowing capability between adjacent layers, and increase a contacting area between the solder and the connection terminal to improve the connection firmness.

The PCB and the method of manufacturing the PCB in the embodiments of the present disclosure may be applied to not only an application scenario where a high element is to be provided, but also an application scenario where maintainability of the element need to be ensured while reducing a height of the element, or increasing the current flowing capability of a layer adjacent to a region where the element is located as well as a welding strength.

The same or similar contents in the embodiments will not be repeated, i.e., each embodiment merely focuses on the difference from the others.

Although the preferred embodiments are described above, a person skilled in the art may make modifications and alterations to these embodiments in accordance with the basic concept of the present disclosure. So, the attached claims are intended to include the preferred embodiments and all of the modifications and alterations that fall within the scope of the present disclosure.

It should be further appreciated that, such words as "first" and "second" are merely used to separate one entity or operation from another entity or operation, but are not necessarily used to represent or imply any relation or order between the entities or operations. In addition, such terms as "include" or "including" or any other variations involved in the present disclosure intend to provide non-exclusive coverage, so that a procedure, method, article or device including a series of elements may also include any other elements not listed herein, or may include any inherent elements of the procedure, method, article or device. If without any further limitations, for the elements defined by such sentence as "including one . . . ", it is not excluded that the procedure, method, article or device including the elements may also include any other identical elements.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A Printed Circuit Board (PCB), comprising:
    a PCB body, a first surface of the PCB body being provided with a groove; and
    a PCB element comprising a connection terminal, a part of the PCB element being arranged within the groove, the connection terminal comprising a first portion arranged within the groove and a second portion arranged outside the groove, and the first portion being electrically connected to conductive layers in the PCB body;
    wherein the PCB body comprises a plurality of conductive layers, a dielectric layer is arranged between two adjacent conductive layers, a layer adjacent to the first surface of the PCB body is a first conductive layer, a layer adjacent to a second surface of the PCB body is a second conductive layer, and the first surface is opposite to the second surface;
    wherein the PCB body comprises a conductive structure, and the groove is formed in the conductive structure,
    wherein the conductive structure comprises a part of the first conductive layer and a conductive material filled between the part of the first conductive layer and a part of a third conductive layer, and the third conductive layer is arranged adjacent to the first conductive layer or spaced apart from the first conductive layer by a predetermined quantity of conductive layers,
    wherein the part of the third conductive layer forms the bottom surface of the groove, a dielectric portion is formed in the middle of the bottom surface, a conductive portion is formed at two ends of the bottom surface, and a cross section of the conductive structure forms the side wall of the groove,
    wherein exposed surfaces of layers corresponding to a cross section of the conductive structure are all conductive, and the exposed surfaces comprise a first exposed surface for the part of the first conductive layer and a second exposed surface for the conductive material, and
    wherein a third surface of the first portion that is opposite to the exposed surfaces is connected to the exposed surfaces via a conductive member, and the conductive member is disposed between the third surface and the exposed surfaces.

2. The PCB according to claim 1, wherein the second portion of the connection terminal is connected to the first conductive layer through a conductive member.

3. The PCB according to claim 2, wherein the conductive member is a solder.

4. The PCB according to claim 1, wherein a side wall of the groove consists of a cross section of at least one conductive layer and a cross section of at least one dielectric layer, a bottom surface of the groove is a conductive layer, a dielectric portion is formed in the middle of the bottom surface, and a conductive portion is formed at two ends of the bottom surface.

5. The PCB according to claim 4, wherein the first portion of the connection terminal is connected to a cross section of the first conductive layer and the conductive portion at the bottom surface of the groove.

6. The PCB according to claim 5, wherein the first portion of the connection terminal is connected to the conductive portion at the bottom surface of the groove through a conductive member.

7. The PCB according to claim 6, wherein the conductive member is a solder.

8. The PCB according to claim 1, wherein the first portion of the connection terminal is connected to the side wall of the groove through a conductive member and connected to the conductive portion at the bottom surface of the groove through the conductive member.

9. The PCB according to claim 8, wherein the conductive member is a solder.

10. The PCB according to claim 1, wherein the PCB element comprises two connection terminals arranged opposite to each other, each of the two connection terminal comprises a first portion arranged within the groove, first portions of the connection terminals are electrically connected to the conductive layers in the PCB body, and the conductive layers connected to the two first portions are separated from each other.

11. A mobile terminal, comprising the PCB according to claim 1.

12. A method of manufacturing a Printed Circuit Board (PCB), comprising:
    forming a groove in a PCB body; and
    arranging a PCB element within the groove, so that a part of the PCB element is arranged within the groove,
    wherein a connection terminal of the PCB element comprises a first portion arranged within the groove and a second portion arranged outside the groove, and the first portion is electrically connected to conductive layers in the PCB body;
    wherein the forming the groove in the PCB body comprises:
    forming a blind hole in the PCB body comprising a plurality of conductive layers to enable a first conductive layer to be connected to a third conductive layer, the first conductive layer being a conductive layer arranged adjacent to a first surface of the PCB body, the third conductive layer being a conductive layer arranged adjacent to the first conductive layer or spaced apart from the first conductive layer by a predetermined quantity of conductive layers;
    filling a conductive material in the blind hole, so that a predetermined portion of the first conductive layer and the conductive material in the blind hole form a conductive structure, the predetermined portion being a portion of the first conductive layer corresponding to the blind hole; and forming the groove in the conductive structure, wherein exposed surfaces of layers corresponding to a cross section of the conductive structure are all conductive, and the exposed surfaces comprise a first exposed surface for the part of the first conductive layer and a second exposed surface for the conductive material, and the method further comprises;

forming a conductive member between the exposed surfaces and a third surface of the first portion that is opposite to the exposed surfaces, so that the third surface is connected to the exposed surfaces via the conductive member.

13. The method according to claim 12, wherein the forming the groove in the PCB body comprises forming, through a laser beam, the groove in a first surface of the PCB body acquired after lines and via-holes have been formed.

14. The method according to claim 12, wherein the forming the groove in the PCB body comprises forming the groove in the PCB body comprising a plurality of conductive layers, so that a cross section of at least one conductive layer and a cross section of at least one dielectric layer of the PCB body form an inner wall of the groove and one conductive layer forms a bottom surface of the groove, wherein a dielectric portion is formed in the middle of the bottom surface, and a conductive portion is formed at two ends of the bottom surface.

15. The method according to claim 12, wherein prior to arranging the PCB element within the groove, the method further comprises applying a solder within the groove at a position where the connection terminal is to be connected to the conductive layer through a stencil printing process or a spraying process.

16. The method according to claim 12, wherein the arranging the PCB element within the groove comprises:
arranging the PCB element within the groove through a laminator;
enabling the second portion of the connection terminal of the PCB element to be connected to the first conductive layer adjacent to a first surface of the PCB body through a conductive member; and
enabling the PCB body and the PCB element to move through a reflow over, so as to enable the PCB element to be connected to the PCB body through welding.

* * * * *